United States Patent [19]

Anceau

[11] Patent Number: 5,401,985
[45] Date of Patent: * Mar. 28, 1995

[54] LOW VOLTAGE MONOLITHIC PROTECTION DIODE WITH A LOW CAPACITANCE

[75] Inventor: Christine Anceau, Saint Roch, France

[73] Assignee: SGS-Thomson Microelectronics S.A., Gentilly, France

[*] Notice: The portion of the term of this patent subsequent to May 10, 2011 has been disclaimed.

[21] Appl. No.: 233,132

[22] Filed: Apr. 26, 1994

Related U.S. Application Data

[63] Continuation of Ser. No. 977,821, Nov. 17, 1992, Pat. No. 5,311,042.

[30] Foreign Application Priority Data

Nov. 18, 1991 [FR] France ................... 91 14446

[51] Int. Cl.⁶ .............. H01L 29/90; H01L 29/747
[52] U.S. Cl. .................. 257/173; 257/110; 257/112; 257/132; 257/154; 257/162; 257/355; 257/603; 257/610
[58] Field of Search ............. 257/109, 110, 112, 132, 257/154, 162, 173, 174, 177, 603, 605, 610, 355

[56] References Cited

U.S. PATENT DOCUMENTS 4,922,371  5/1990  Gray et al. .

5,311,042  5/1994  Anceau ................. 257/173

FOREIGN PATENT DOCUMENTS 2234126  1/1991  United Kingdom .

OTHER PUBLICATIONS

Patent Abstracts of Japan, vol. 10, No. 221.

*Primary Examiner*—Ngân V. Ngô
*Attorney, Agent, or Firm*—Wolf, Greenfield & P.C.

[57] ABSTRACT

A monolithic protection component is formed in a P-type low-doped semiconductor substrate. The protection diode comprises, in an upper surface of the substrate, a first and a second N-type well with a mean doping level; at the surface of the first well, a first highly doped P region; at the surface of the second well, a second very highly doped N region; a third very highly doped N region laterally contacting the first well; a fourth highly-doped P region beneath a portion of the lower surface of the third region; a first metallization contacting the surface of the first and second regions which constitute the first diode terminal; and a second metallization coupled to a P-type area extending up to the fourth region and second well, which forms the second terminal of the diode. The protection component provides a unidirectional protection diode. Two of the protection components may be combined in a single structure to provide a bidirectional protection diode.

10 Claims, 3 Drawing Sheets

LOW VOLTAGE MONOLITHIC PROTECTION DIODE WITH A LOW CAPACITANCE

This application is a continuation of application Ser. No. 07/977,821, filed Nov. 17, 1992, now U.S. Pat. No. 5,311,042.

BACKGROUND OF THE INVENTION

1. Field of the Invention

The present invention relates to protection diodes and more particularly to low voltage protection diodes.

2. Discussion of the Related Art

A unidirectional protection diode Z1 (FIG. 1A) is a component allowing current to flow in a forward direction (from terminal B to terminal A) and blocking current in the reverse direction (from terminal A to terminal B) as long as the voltage does not exceed a predetermined threshold. A bidirectional diode Z2 (FIG. 2A) is a component allowing current to flow from terminal C to terminal D or from terminal D to terminal C only when the voltage between these terminals exceeds a predetermined threshold.

Such diodes are disposed in parallel on circuits to be protected and are operative only when exceptional voltage surges occur. Therefore, during a normal state of the power supply or under normal operating conditions of the circuit, the diodes must not impair the circuit operation. However, it is known that a low voltage protection diode has a relatively high capacitance between its terminals. Indeed, the capacitance across a diode increases in proportion to the surface area of the useful junction of this diode and exponentially with the doping level of the least doped layer at the junction. In practice, in the case of a protection diode, if it is desired to obtain a relatively low breakdown voltage, ranging approximately from 5 to 10 volts, the doping level of the least doped layer must be high (approximately 1 to $5 \times 10^{18}$ atoms/cm$^3$) and, therefore, the diode capacitance is unavoidably high. For example, a low voltage protection diode having a breakdown voltage of approximately 5 volts has a capacitance of approximately 5000 pF/mm$^2$. To meet its protection function requirements, the surface area of this type of component is seldom lower than 0.5 mm$^2$; this leads to a 2500 pF capacitance. This relatively high value is liable to impair the operation of the circuit to be protected.

To solve this problem, it has been proposed in the prior art to combine the protection diodes with simple conventional rectifying diodes in various circuit configurations. All these various configurations have exhibited drawbacks and have not enabled hitherto realization of monolithic protection components.

Summary of the Invention

An object of the invention is to combine protection diodes with conventional diodes making it possible to obtain a low capacitance protection component.

Another object of the invention is to combine, in the form of a monolithic component, diodes to form the equivalent of a low capacitance protection diode.

To achieve this object and others, one embodiment of the invention provides a monolithic protection component formed in a semiconductor substrate of a first conductivity type having a low doping level, including a first and a second well of a second conductivity type with a mean doping level; at the surface of the first well, a first region of the first conductivity type with a high doping level; at the surface of the second well, a second region of the second conductivity type with a very high doping level; a third region of the second conductivity type with a very high doping level contacting the first well; a fourth region of the first conductivity type with a high doping level under a lower surface of the third region; a first metallization, contacting the surface of the first and second regions, comprising the terminal of a first diode; and a second metallization, coupled to an area of the first conductivity type extending up to the fourth region and second well, comprising the second terminal of the diode. The above-described structure provides a monolithic unidirectional protection diode.

According to an embodiment of the invention, the lower surface of the substrate includes an overdoped layer of the first conductivity type, while the second metallization contacts this lower surface.

According to an embodiment of the invention, the first conductivity type is the P-type.

According to an embodiment of the invention, the second and third regions result from a single doping step.

According to an embodiment of the invention, the first and fourth regions result from a single doping step carried out before the doping step of the second and third regions.

The invention further provides, in another embodiment, a monolithic bidirectional protection component combining two symmetrical semiconductor structures similar to the one of the above-mentioned unidirectional protection diode, the third and fourth regions being common to these two symmetrical semiconductor structures. The bidirectional component comprises two symmetrical metallizations which correspond to the first metallization of the unidirectional diode. This embodiment of the invention provides a monolithic bidirectional protection diode.

According to an embodiment of the invention, the deep portions of the first and second wells comprise means for reducing the lifetime of any minority carriers such as gold or platinum diffusion.

A further advantage of the bidirectional protection diode according to the invention is its low dynamic capacitance. The protection diode included in the component is always biased in the same direction and, therefore, if the voltage polarity across the component changes, but does not exceed the threshold voltage of the component, the charge of the component always has the same polarity.

The foregoing and other objects, features, aspects and advantages of the invention will become apparent from the following detailed description of the present invention which should be read in conjunction with the accompanying drawings.

DETAILED DESCRIPTION

Figure 3:
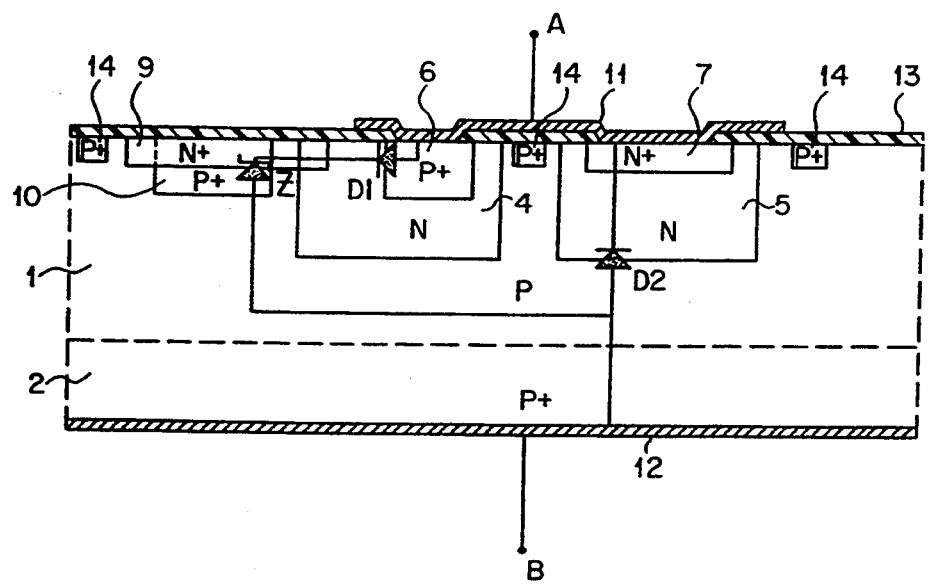
FIG. 3 illustrates an embodiment of a low capacitance unidirectional protection component according to the invention.
Figure 4:
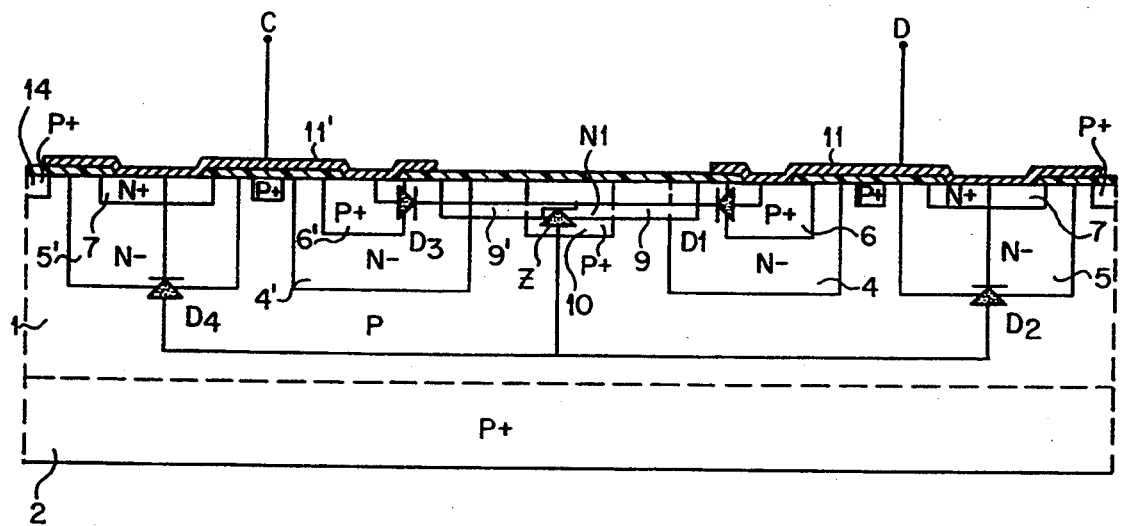
FIG. 4 illustrates an embodiment of a low capacitance bidirectional protection component according to the invention.

In FIGS. 3 and 4, which are cross-sectional views of semiconductor structures, it will be noted that, as is conventional, the thickness and lateral dimensions of the layers are not drawn to scale in order to facilitate legibility and understanding of the drawings. Those skilled in the art know the conventional thicknesses and dimensions of layers to be selected as a function of currents that are to flow and the desired capacitances.

Figure 1A:
FIGS. 1A and 2A illustrate conventional symbols used for unidirectional and bidirectional protection diodes.
Figure 1B:
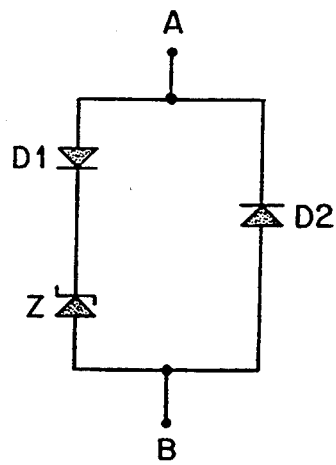
FIGS. 1B and 2B schematically illustrate diode structures corresponding to a unidirectional and a bidirectional low capacitance protection diode, respectively.

FIG. 1B shows an assembly of diodes having the same function as the protection diode (which may be an avalanche diode or a zener diode) Z1 of FIG. 1A. This diode connection comprises, between terminals A and B, a diode having its anode connected to terminal A and its cathode connected to the cathode of a zener diode Z corresponding to diode Z1. The anode of zener diode Z is connected to terminal B. A diode D2 has its cathode connected to terminal A and B. Diode D2 is reverse biased with respect to diode D1. Thus, when terminal B becomes positive with respect to terminal A, current flows through diode D2 and through diode Z1 from terminal B to terminal A because diodes D2 and Z are forward biased. When terminal A becomes positive with respect to terminal B, diode D2 is reverse biased, as well as diode Z. Current flows through diodes D1 and Z to protect the device disposed between terminals A and B only when terminal A has a positive voltage higher than the voltage of terminal B plus the avalanche voltage of diode Z increased by the forward voltage drop of diode D1 (approximately 0.6 to 0.7 volt). This circuit has the same function as the circuit of FIG. 1A. However, since diodes D1 and D2 are conventional rectifying diodes with a very high avalanche voltage, their capacitance is very low, for example, approximately 0.1 to 0.5 pF. Since the capacitance of diode Z is very high with respect to that of diode D1, the series connection of the two diodes provides a capacitance substantially equal to that of diode D1; the overall capacitance between terminals A and B being substantially equal to the sum of the capacitance of diodes D1 and D2. Thus, a protection component having a capacitance of approximately 0.1 to 0.5 pF instead of several thousand pF is obtained.

Figure 2A:
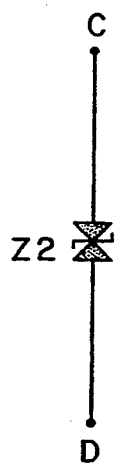
Figure 2B:
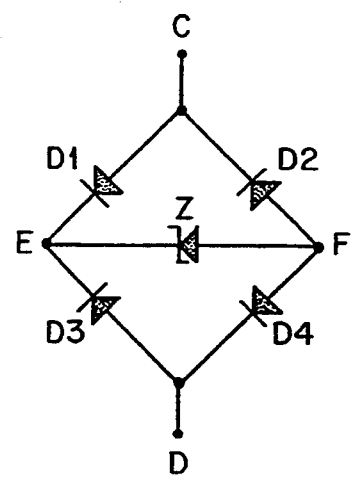

FIG. 2B shows a bidirectional protection diode corresponding to the protection diode Z2 of FIG. 2A. The device comprises, between terminals C and D, a diode bridge including diodes D1–D4. A protection diode Z is connected between points E and F of the diode bridge. Diode Z must have an avalanche voltage equal to the avalanche voltage of the double protection diode Z2 minus two forward voltage drops of a diode. Indeed, in this circuit, a current flows between terminals C and D only if the voltage on one terminal, in either direction, is higher than the voltage at the other terminal by a value equal to the avalanche voltage of diode Z plus two forward voltage drops of a diode (approximately 0.6 to 0.7 volt). If terminal C is positive, current flows through diodes D1, Z, and D4. If terminal D is positive, current flows through diodes D3, Z and D2. In both cases, diode Z is biased in the same direction (i.e., reverse biased) and, therefore, when the direction of the voltage changes, capacitive charges are not transferred from one terminal of this diode to the other. Thus, this connection does not cause any significant dynamic capacitance effect.

The applicant has found that the circuits shown in FIGS. 1B and 2B can be implemented with monolithic semiconductor circuits having a relatively simple structure.

FIG. 3 illustrates a monolithic integrated protection component according to the invention of the circuit of FIG. 1B.

On the semiconductor structure of FIG. 3 are superimposed, at the position of the junctions having an active role, the symbols of diodes D1, D2, and Z of FIG. 1B for clarity of understanding the invention.

The structure comprises a P-type substrate 1. Conventionally, substrate 1 can be formed on a P+ doped silicon layer 2 on which substrate 1 is obtained by epitaxial growth. In substrate 1 are formed two N-type wells, 4 and 5, respectively. In well 4 is formed a P+ region 6. In well 5 is formed an N+ region 7.

On the side of N well 4, and in lateral contact therewith, is formed an N+ region 9, beneath a portion of which is a P+ region 10. Region 10 is disposed beneath region N+ without contacting well 4. The upper surfaces of P+ region 6 and N+ region 7 are interconnected through a metallization 11 which forms terminal A in FIG. 1B. The lower surface of the semiconductor structure is also coated with a metallization 12 which forms terminal B in FIG. 1B. An insulating layer 13 coats the upper surface of the semiconductor structure where contact with metallization 11 is not desired.

Diodes D1, D2, and Z are represented to illustrate the equivalence between the semiconductor structure and the drawing of FIG. 1B. It can be seen that this structure is particularly simple to manufacture. In fact, the two N-type wells 4 and 5 result from a single doping step (through diffusion or implantation). Then, either separately or simultaneously, the P+ layers 6 and 10 and N+ regions 7 and 9 are formed. The only critical doping of this structure is the one existing at the interface between P+ region 10 and N+ region 9 which determines the avalanche voltage of the protection diode.

By way of example, substrate 1 can have a doping level of approximately $10^{15}$ atoms/cm$^3$. N wells 4 and 5 result from a diffusion such that, at the interface between N region 4 and P+ region 6, the doping level of the N well is approximately $10^{16}$ atoms/cm$^3$. The P+ region 10 is formed so that its doping level at its interface with N+ region 9 is approximately $10^{18}$ atoms/cm$^3$ (this value being chosen as a function of the desired avalanche voltage). N+ regions conventionally have a high doping level of approximately $10^{20}$ atoms/cm$^3$.

Conventionally, P+ stop-channel areas 14 can be provided on both sides of each N-type region.

It is to be noted that with this structure, a parasitic transistor formed by P+ region 6, N well 4 and substrate 1, can occur. Various conventional means can be used to limit the gain of this transistor. For example, the lifetime of any minority carriers in the N region can be reduced by gold or platinum doping.

FIG. 4 illustrates a monolithic integrated protection component according to the invention of the circuit of FIG. 2B. The right portion of this structure, including diodes D1, D2, and Z, is the same as the structure of FIG. 3. The left portion of FIG. 4, includes diodes D3, D4, and Z. Each corresponding component is designated, as in the right portion, by the same reference character with a prime sign. One skilled in the art will understand that the structure including diodes D3, D4, and Z is symmetric with respect to the structure including diodes D1, D2, and Z and may be constructed in the same manner. In this embodiment, no contact is provided on the lower surface of the substrate; the component terminals are formed by the two metallizations 11 and 11'.

As is apparent to those skilled in the art, various modifications can be made to the above disclosed preferred embodiments without departing from the spirit of the invention. Although FIG. 3 shows a preferred embodiment of the invention, it is possible to fabricate, for example, to account for compatibility with other components formed in the same semiconductor substrate, an identical structure while inverting all the conductivity types.

Figure 5:
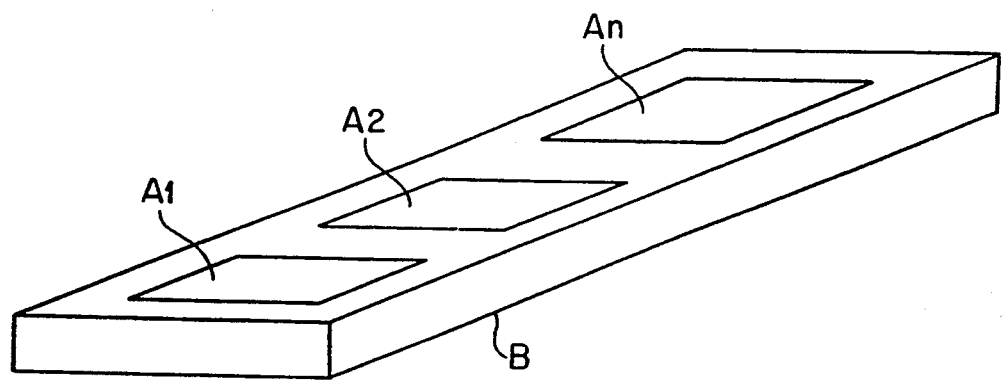
FIGS. 5 and 6 are top views of assemblies of diodes according to the invention.
Figure 6:
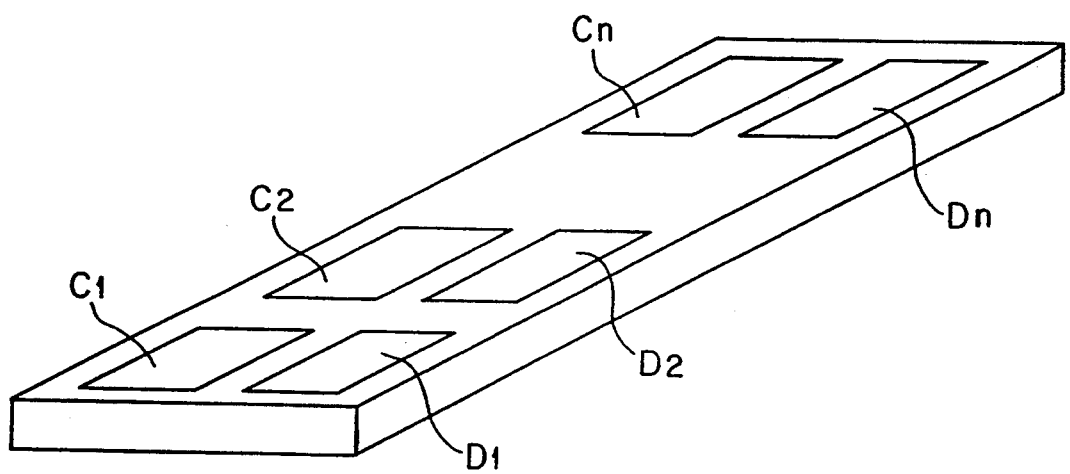

As schematically shown in the perspective views of FIGS. 5 and 6, several unidirectional protection diodes having several electrodes $A_1, A_2 \ldots A_n$ (FIG. 5) or several bidirectional protection diodes (FIG. 6) with several electrodes $C_1, C_2 \ldots C_n$ and $D_1, D_2 \ldots D_n$ can be disposed on the same substrate.

The foregoing description is by way of example only and is not intended as limiting. The invention is limited only as defined in the following claims and equivalents thereto.

I claim:

1. A monolithic protection component, comprising:
   a low-doped substrate of a first conductivity type having a first surface and a second surface;
   a first well of a second conductivity type having a mean doping level formed in the low-doped substrate at the first surface thereof;
   a second well of the second conductivity type having the mean doping level formed in the low-doped substrate at the first surface thereof;
   a first highly-doped region of the first conductivity type formed in the first well at a surface thereof;
   a second highly-doped region of the second conductivity type formed in the second well at a surface thereof;
   a third very highly-doped region of the second conductivity type formed in the low-doped substrate at the first surface thereof and in contact with the first well;
   a fourth highly-doped region of the first conductivity type formed in the low-doped substrate in contact with the third region;
   a first terminal including a conductor in contact with the respective surfaces of the first and second highly-doped regions; and
   a second terminal.

2. The monolithic protection component of claim 1 wherein the second terminal includes a second conductor coupled to a portion of the substrate in contact with the fourth region and the second well.

3. The protection component of claim 1, further comprising:
   a third well of the second conductivity type having a mean doping level formed in the low-doped substrate at the first surface thereof;
   a fourth well of the second conductivity type having a mean doping level formed in the low-doped substrate at the first surface thereof;
   a fifth highly-doped region of the first conductivity type formed in the third well at a surface thereof; and
   a sixth highly-doped region of the second conductivity type formed in the fourth well at a surface thereof.

4. The protection component of claim 3, wherein the second terminal includes a second conductor in contact with the respective surfaces of the fifth and sixth regions.

5. A monolithic protection component, comprising:
   at least one monolithic protection diode formed in a low-doped substrate of a first conductivity type having a first surface and a second surface, the monolithic protection diode comprising:
   a first well of a second conductivity type having a mean doping level formed in the low-doped substrate at the first surface thereof;
   a second well of the second conductivity type having the mean doping level formed in the low-doped substrate at the first surface thereof;
   a first highly-doped region of the first conductivity type formed in the first well at a surface thereof;
   a second highly-doped region of the second conductivity type formed in the second well at a surface thereof;
   a third very highly-doped region of the second conductivity type formed in the low-doped substrate at the first surface thereof and in contact with the first well;
   a fourth highly-doped region of the first conductivity type formed in the low-doped substrate in contact with the third region;
   a first terminal including a first conductor in contact with the respective surfaces of the first and second regions; and
   a second terminal.

6. A monolithic unidirectional protection component, comprising:
   a low-doped substrate of a first conductivity type having a first surface and a second surface;
   a first well of a second conductivity type having a mean doping level formed in the low-doped substrate at the first surface thereof;
   a second well of the second conductivity type having the mean doping level formed in the low-doped substrate at the first surface thereof;
   a first highly-doped region of the first conductivity type formed in the first well at a surface thereof;
   a second highly-doped region of the second conductivity type formed in the second well at a surface thereof;
   a third very highly-doped region of the second conductivity type formed in the low-doped substrate at the first surface thereof and in contact with the first well;
   a fourth highly-doped region of the first conductivity type formed in the low-doped substrate in contact with the third region;
   a first terminal including a first conductor in contact with the respective surfaces of the first and second highly doped regions; and
   a second terminal including a second conductor coupled to a portion of the substrate in contact with the fourth region and the second well.

7. A monolithic bidirectional protection component, comprising:
   a low-doped substrate of a first conductivity type having a first surface and a second surface;
   a first well of a second conductivity type having a mean doping level formed in the low-doped substrate at the first surface thereof;

a second well of the second conductivity type having the mean doping level formed in the low-doped substrate at the first surface thereof;

a first highly-doped region of the first conductivity type formed in the first well at a surface thereof;

a second very highly-doped region of the second conductivity type formed in the low-doped substrate at the first surface thereof and in contact with the first well;

a third highly-doped region of the first conductivity type formed in the low-doped substrate in contact with the third region;

a third well of the second conductivity type having a mean doping level formed in the low-doped substrate at the first surface thereof;

a fourth well of the second conductivity type having a mean doping level formed in the low-doped substrate at the first surface thereof;

a fourth highly-doped region of the first conductivity type formed in the third well at a surface thereof;

a fifth highly-doped region of the second conductivity type formed in the fourth well at a surface thereof;

a first terminal including a first conductor in contact with the respective surfaces of the first and second highly-doped regions; and a second terminal including a second conductor in contact with the respective surfaces of the fifth and sixth regions.

8. A monolithic protection component, comprising:

a plurality of monolithic unidirectional protection diodes formed in a low-doped substrate of a first conductivity type having a first surface and a second surface, each of the monolithic protection diodes comprising:

a first well of a second conductivity type having a mean doping level formed in the low-doped substrate at the first surface thereof;

a second well of the second conductivity type having the mean doping level formed in the low-doped substrate at the first surface thereof;

a first highly-doped region of the first conductivity type formed in the first well at a surface thereof;

a second highly-doped region of the second conductivity type formed in the second well at a surface thereof;

a third very highly-doped region of the second conductivity type formed in the low-doped substrate at the first surface thereof and in contact with the first well;

a fourth highly-doped region of the first conductivity type formed in the low-doped substrate in contact with the third region;

a first terminal including a first conductor in contact with the respective surfaces of the first and second regions; and a second terminal including a second conductor coupled to a portion of the substrate in contact with the fourth region and the second well.

9. A monolithic protection component, comprising:

a plurality of monolithic bidirectional protection diodes formed in a low-doped substrate of a first conductivity type having a first surface and a second surface, each of the monolithic protection diodes comprising:

a first well of a second conductivity type having a mean doping level formed in the low-doped substrate at the first surface thereof;

a second well of the second conductivity type having the mean doping level formed in the low-doped substrate at the first surface thereof;

a first highly-doped region of the first conductivity type formed in the first well at a surface thereof;

a second highly-doped region of the second conductivity type formed in the second well at a surface thereof;

a third very highly-doped region of the second conductivity type formed in the low-doped substrate at the first surface thereof and in contact with the first well;

a fourth highly-doped region of the first conductivity type formed in the low-doped substrate in contact with the third region;

a third well of the second conductivity type having a mean doping level formed in the low-doped substrate at the first surface thereof;

a fourth well of the second conductivity type having a mean doping level formed in the low-doped substrate at the first surface thereof;

a fifth highly-doped region of the first conductivity type formed in the third well at a surface thereof;

a sixth highly-doped region of the second conductivity type formed in the fourth well at a surface thereof;

a first terminal including a first conductor in contact with the respective surfaces of the first and second highly-doped regions; and a second terminal including a second conductor in contact with the respective surfaces of the fifth and sixth regions.

10. A monolithic unidirectional protection component, comprising:

a low-doped substrate of a first conductivity type having a first surface and a second surface;

a first well of a second conductivity type having a mean doping level formed in the low-doped substrate at the first surface thereof;

a second well of the second conductivity type having the mean doping level formed in the low-doped substrate at the first surface thereof;

a first highly-doped region of the first conductivity type formed in the first well at a surface thereof;

a second highly-doped region of the second conductivity type formed in the second well at a surface thereof;

a third very highly-doped region of the second conductivity type formed in the low-doped substrate at the first surface thereof and in contact with the first well;

a fourth highly-doped region of the first conductivity type formed in the low-doped substrate in contact with of the third region;

a first terminal including a first conductor in contact with the respective surfaces of the first and second highly-doped regions; and a second terminal including a second conductor coupled to a portion of the substrate in contact with the fourth region and the second well.

* * * * *